(12) United States Patent
Sugiura et al.

(10) Patent No.: US 6,777,612 B2
(45) Date of Patent: Aug. 17, 2004

(54) ELECTRONIC DEVICE SEALING ELECTRONIC ELEMENT THEREIN AND MANUFACTURING METHOD THEREOF, AND PRINTED WIRING BOARD SUITABLE FOR SUCH ELECTRONIC DEVICE

(75) Inventors: Ryouji Sugiura, Sagamihara (JP); Masayuki Sakurai, Tokyo (JP); Kenichi Masuda, Sagamihara (JP)

(73) Assignee: Hitachi AIC Inc., Tokyo (JP)

( * ) Notice: Subject to any disclaimer, the term of this patent is extended or adjusted under 35 U.S.C. 154(b) by 0 days.

(21) Appl. No.: 09/930,944

(22) Filed: Aug. 17, 2001

(65) Prior Publication Data

US 2002/0023765 A1 Feb. 28, 2002

(30) Foreign Application Priority Data

Aug. 25, 2000 (JP) ........................................ 2000-254973
Sep. 1, 2000 (JP) ........................................ 2000-265013

(51) Int. Cl.[7] ............................................. H01L 23/02
(52) U.S. Cl. .................. 174/52.4; 174/52.3; 257/692; 257/696; 257/730; 257/735; 257/778
(58) Field of Search ................................ 257/692, 696, 257/730, 735, 680, 681, 778, 737, 738; 174/52.2, 52.4

(56) References Cited

U.S. PATENT DOCUMENTS

| | | | |
|---|---|---|---|
| 3,622,419 A | | 11/1971 | London et al. .............. 156/242 |
| 4,888,449 A | * | 12/1989 | Crane et al. ................ 174/52.4 |
| 5,729,437 A | | 3/1998 | Hashimoto ................... 361/760 |
| 5,834,835 A | * | 11/1998 | Maekawa .................... 257/680 |
| 6,303,978 B1 | * | 10/2001 | Daniels et al. .............. 257/642 |

FOREIGN PATENT DOCUMENTS

JP 10163647 6/1998

OTHER PUBLICATIONS

Patent Abstracts of Japan, S. Kimio, Japanese Laid–Open No. 02–179018, Dec. 7, 1990.

* cited by examiner

*Primary Examiner*—Hung V. Ngo
(74) *Attorney, Agent, or Firm*—Antonelli, Terry, Stout & Kraus, LLP

(57) ABSTRACT

An electronic device is provided which includes a substrate of insulating resin having at least a pair of interior terminal portions on an upper surface thereof, an electronic element mounted on the terminal portions, having at least a pair of electrode terminals thereof, and a member of insulating resin, bonded on the upper surface of said substrate. The frame includes a cavity to store the electronic element. A cover member of insulating material hermetically seals over the cavity. Electrodes are formed at or in vicinity of positions of the terminals of said electronic element to electrically conduct the interior terminal portions for connection outside the device. Alternatively, roughened surfaces can be formed on metal electrode portions, which are formed on the upper surface of substrate for electrically conducting said interior terminal portions to exterior terminal portions.

11 Claims, 7 Drawing Sheets

ELECTRONIC DEVICE SEALING ELECTRONIC ELEMENT THEREIN AND MANUFACTURING METHOD THEREOF, AND PRINTED WIRING BOARD SUITABLE FOR SUCH ELECTRONIC DEVICE

BACKGROUND OF THE INVENTION

The present invention relates to an electronic device, in which an electronic element is hermetically sealed, and a method for manufacturing thereof, and further a printed wiring board being suitable for use in such an electronic device.

Conventionally, an electronic element, such as a SAW (Surface Acoustic Wave) element, etc., is hermetically sealed within an electronic part case, for the purpose of protecting the property or characteristics of the SAW element from being damaged, and it is supplied in the form of an electronic device, such as a SAW filter device, etc. For sealing such an electronic element within the electronic part case, the element must be mounted and hermetically sealed within it, so that it has no contact with members constructing the case, while terminal portions thereof, being electrically connected to the element, must be led out to an outside of the case. For the electronic part case for use in such an arrangement, a ceramic case is well known. For example, with a electronic part, which comprises a built-in SAW element of surface-mount type therein, a chip of the SAW element is mounted within the ceramic case and it is treated with wire-bonding thereon, thereafter a cover is welded onto the case, thereby sealing between them. Also, the structure is disclosed, in which the SAW element is received or stored within a resin package while using the resin package in combination with a frame made from a resin plate and the cover on a wiring board made from a copper-clad laminate, for example, in Japanese Patent Laying-Open No. Hei 2-179018 (1990) and Japanese Patent Laying-Open No. Hei 10-16 647 (1998).

However, the form of those conventional electronic devices mentioned above is inappropriate or mass production of cheap and small-sized electronic devices in large number thereof, since the ceramic case itself is expensive and is not suitable material for small-size structures. Also, it is difficult to take or cut out large numbers of ceramic cases from a large-sized ceramic material. Also, the latter device mentioned above has a drawback that the characteristics of the built-in electronic element, such a the SAW filter element, etc., are deteriorated, since a frame made of resin is attached or adhered upon conductor patterns of the printed wiring board. Specifically, bonding power of the resin case on the conductor patterns on the printed wing board is weak and sealing property is low between them.

SUMMARY OF THE INVENTION

An object according to the present invention is, for overcoming such drawbacks in the conventional parts mentioned above, to provide an electronic device in which an electronic element is hermetically sealed, and a method for manufacturing thereof as well, and further a printed wiring board being suitable for use in such the electronic device, wherein a case is formed with attaching a frame member and a cover member made of resin upon the printed wiring board, but without using an expensive ceramic case, thereby being suitable for mass production of cheap and small-sized electronic devices, as well as being superior in hermetical sealing property of the case formed, so as to protect the built-in electronic device from being deteriorated in the characteristics thereof.

According to the present invention, for accomplishing such the object as mentioned above, there is provided an electronic device, comprising: a substrate of insulating resin having at least a pair of interior terminal portions for connection upon an upper surface thereof; an electronic element mounted on the terminal portions on the upper surface of said substrate, having at least a pair of electrode terminals thereof; a frame member of insulating resin, bonded on the upper surface of said substrate, and having a cavity formed for storing said electronic element therein; and a cover member of insulating material, for hermetically sealing over the cavity of said frame member, in which said electronic element is stored, wherein electrodes are formed at or in vicinity of positions of the terminals of said electronic element stored within said cavity, for electrically conducting said interior terminal portions for connection to an outside.

Further, according to the present invention, said electrodes for electrically conducting said interior terminal portions to the outside may be in the form of plated throughholes formed in said substrate, which is filled up with non-conductive resin therein, and in particular, being preferable to be non-penetrating through-holes, i.e., flat throughholes, each being covered with metal conductors on both side surfaces of the resin filled up within the plated throughhole. Also, according to the present invention, the electronic element stored within the cavity may be an optical element, and the cover member for sealing over the cavity may be made of transparent material.

Also, according to the present invention, there is provided an electronic device, comprising: a substrate of insulating resin having at least a pair of interior terminal portions for connection upon an upper surface thereof; an electronic element mounted on the terminal portions on the upper surface of said substrate, having at least a pair of electrode terminals thereof; a frame member of insulating resin, bonded on the upper surface of said substrate, and having a cavity formed for storing said electronic element therein; at least a pair of exterior terminal portions for connection, formed on an outer peripheral surface of said substrate, being electrically conducted to said interior terminals; and a cover member of insulating material, for hermetically sealing over the cavity of said frame member, in which said electronic element is stored, wherein roughened surfaces are formed on metal electrode portions, which are formed on the upper surface of said substrate for electrically conducting said interior terminal portions to said exterior terminal portions, where said frame member is bonded thereupon.

Further, according to the present invention, for accomplishing such the object as was mentioned above, there is also provided a printed wiring board for use in the electronic devices according to the above, comprising a plate made of insulating resin, and plural number of electrode portions for use of said terminals for interior connection, which are formed at or in vicinity of the electrode portions of plural number of the electronic devices to be mounted thereon, and in particular, they are preferable to be in the form of the flat through-holes.

Also, according to the present invention, there is further provided a printed wiring board for use in the electronic devices according to the above, comprising a plate made of insulating resin, and plural number of electrode portions for use of said terminals for interior connection, to be electrically conducted with plural number of electronic devices to be mounted, on at least one surface of said insulating resin plate, wherein surfaces of those electrode portions are roughened where said frame member is bonded thereon.

Moreover, according to the present invention, for accomplishing such the object as mentioned above, there is further provided a method for manufacturing an electronic device, comprising the following steps: (a) forming at least a pair of terminal portions for interior connection, on an upper surface of a substrate of insulating resin; (b) mounting an electronic element on the terminal portions for interior connection, on the upper surface of said substrate; (c) bonding a frame member of insulating resin on the upper surface of said substrate, so as to form a cavity, in which said electronic element is stored; and (d) bonding a cover member of insulating material on said frame member for hermetically sealing over said cavity thereof, in which said electronic element is stored, wherein in the step of said step (a), electrode portions are provided through forming flat through-holes at or in vicinity of positions of electrodes of the electronic element stored within said cavity, for electrically conducting said terminal portions for interior connection to an outside thereof.

And, also according to the present invention, there is further provided a method for manufacturing an electronic device, comprising the following steps: (a) forming at least a pair of terminal portions for interior connection, on an upper surface of a substrate of insulating resin; (b) mounting an electronic element on the terminal portions for interior connection, on the upper surface of said substrate; (c) bonding a frame member of insulating resin on the upper surface of said substrate, so as to form a cavity, in which said electronic element is stored; and (d) bonding a cover member of insulating material on said frame member for hermetically sealing over the cavity thereof, in which said electronic element is stored, wherein in the step of said step (a), roughened surfaces are formed on metal electrodes, which are provided for electrically conducting said terminal portions for interior connection to an outside thereof, where said frame member is bonded thereon.

BRIEF DESCRIPTION OF THE DRAWINGS

Those and other features, objects and advantages of the present invention will become more apparent from the following description when taken in conjunction with the accompanying drawings wherein.

DETAILED DESCRIPTION OF THE INVENTION

Hereinafter, embodiments according to the present invention will be fully explained by referring to the attached drawings.

Figure 1A:
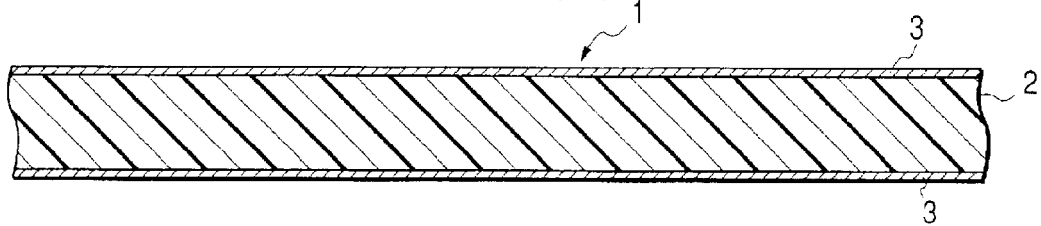
FIGS. 1(a) through 1(e) are enlarged cross-section views of a printed wiring board, for explaining a first half of manufacturing steps, in a method for manufacturing an electronic device, according to an embodiment of the present invention.
Figure 1B:
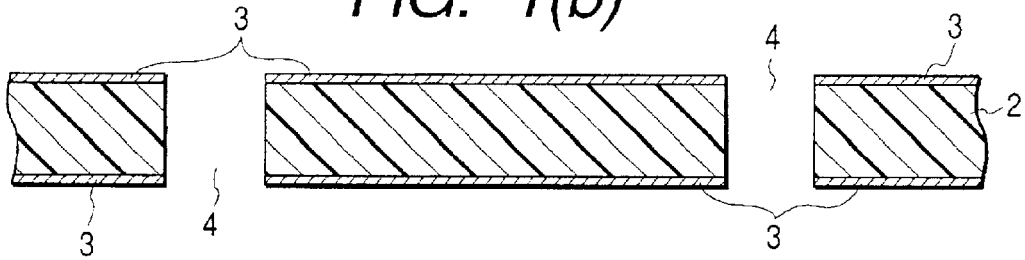
Figure 1C:
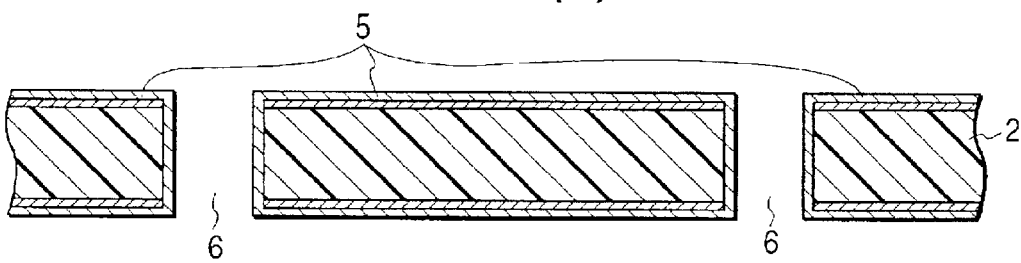
Figure 1D:
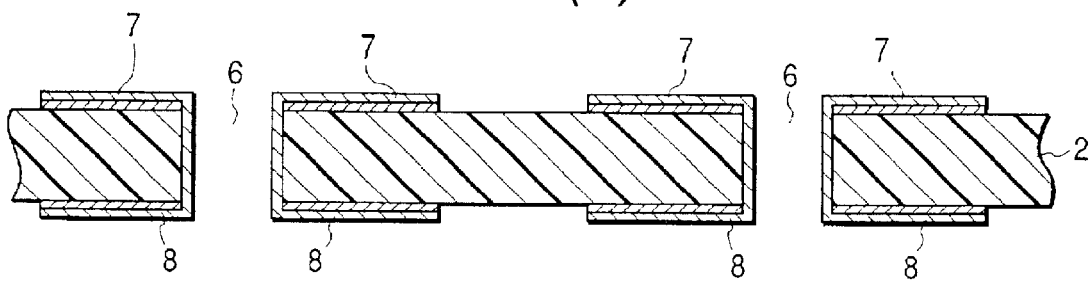
Figure 1E:
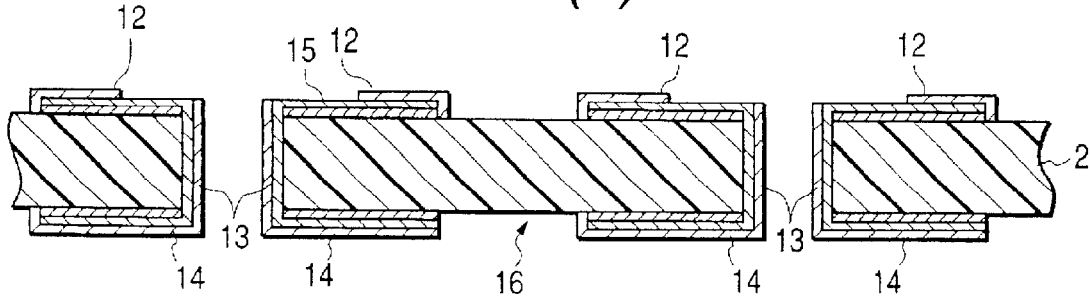
Figure 2A:
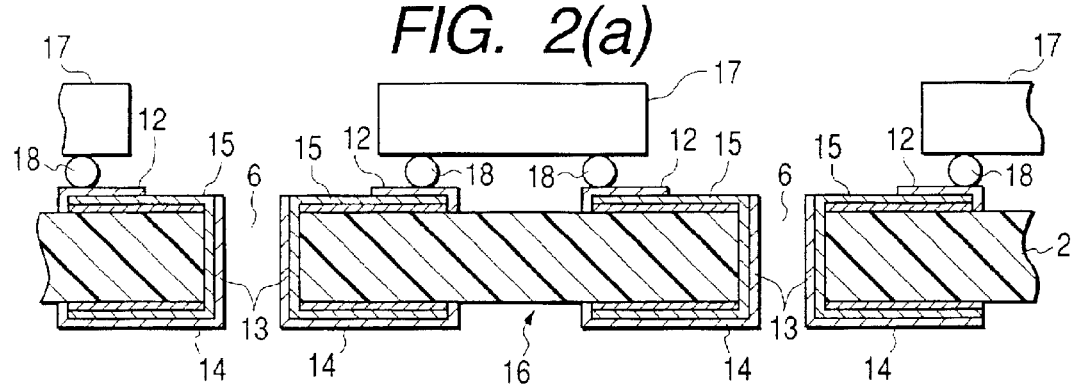
FIGS. 2(a) through 2(c) are also enlarged cross-section views of the printed wiring board, but for explaining a second half of the manufacturing steps, in which an electronic element is mounted on and sealed within the printed wiring board produced through the steps shown in the FIGS. 1(a) through 1(e), in the method for manufacturing the electronic device of the embodiment according to the present invention.
Figure 2B:
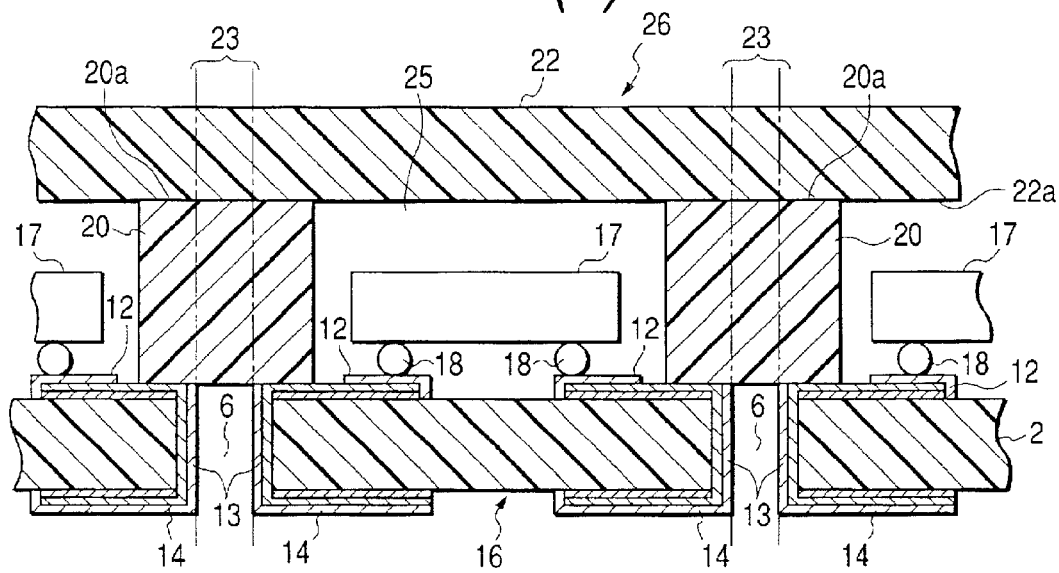
Figure 2C:
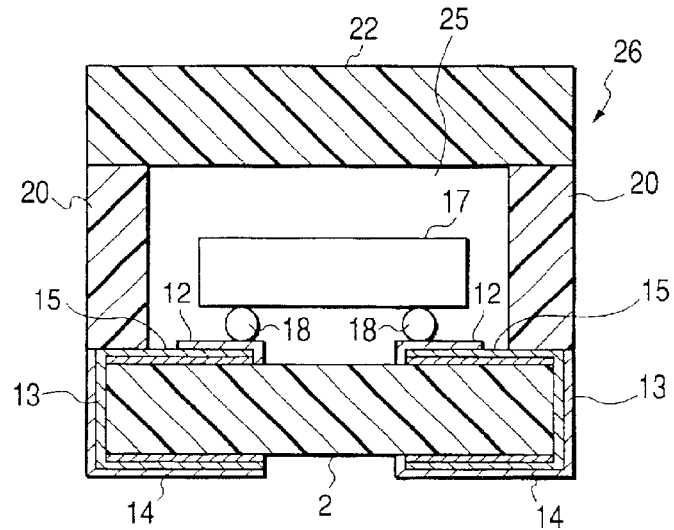

First of all, FIGS. 1(a) through 1(e) are enlarged cross-section views of a printed wiring board, for explaining a first half of manufacturing steps, in a method for manufacturing an electronic device, according to an embodiment of the present invention; and FIGS. 2(a) through 2(c) are also enlarged cross-section views of the printed wiring board, but for explaining a second half thereof.

In FIG. 1(a), firstly, a double-surface or double-sided copper-clad laminate plate 1 is prepared, in which copper foils are clad on both surfaces of an insulation resin plate (substrate) 2. In this drawing, the double-sided copper-clad resin plate is indicated by a reference numeral 1 as a whole, and electronic elements, such as the SAW filter element, etc., are mounted in the following steps which will be mentioned below.

Next, as shown in FIG. 1(b), at predetermined positions on the copper-clad resin plate 1, the penetrating holes 4 and 4 are excavated or opened by means of a drill or the like. After that, as shown in FIG. 1(c), panel plating of copper is further conducted upon the copper-clad resin plate 1, on which the penetrating holes 4 and 4 are opened. Due to this, copper plating films 5 are formed on the copper foils 3, as well as on wall surfaces within those penetrating holes 4 and 4, then the penetrating holes 4 and 4 are built up or developed to be so-called plated through-hole 6 and 6, thereby connecting both side surfaces of the insulation substrate 2, electrically.

Following to the above, as shown in FIG. 1(d), the copper foils 3 and the copper plating films 5, which are formed on both surfaces of the insulation resin substrate 2, are selectively removed by means of etching process, therefore upper surface terminal portions 7 and lower surface terminal portions 8 are formed surrounding the formed plated through-holes 6, so as to be electrically connected with those through-holes 6.

Figure 3:
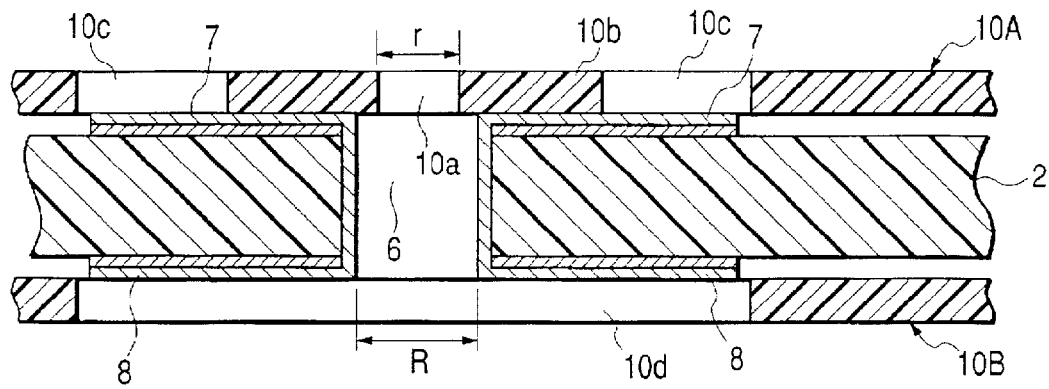
FIG. 3 is an enlarged cross-section view for showing condition of the printed wiring board before being applied with secondary plating thereon, in particular in the step for manufacturing the printed wiring board shown in the FIG. 1(e)

Next, as is shown in FIG. 3 attached, the upper and lower surfaces of the insulation substrate 2 are covered with a pair of masks 10A and 10B made from such as dry films, for example, for conducting exposure and development thereupon, and after that gilding or gold plating process is treated thereon. On the upper surface mask 10A of those masks 10A and 10B are provided piecing openings 10a, which are formed at the positions corresponding to the plated through-holes 6 formed with a diameter "r" being smaller than "R" of the through-holes 6, shielding portions 10b, each covering nearly half of conductor layer provided around the opening 10a for forming the upper surface terminal portion 7 on the side of through-hole 6, and opening portions 10c, for exposing the other nearly half of the conductor layer forming the upper surface terminal portion 7 on the side far from the through-hole 6. On the other hand, on the mask 10b are provided opening portions 10d for exposing the through-holes 6 and the lower surface terminal portions 8 therethrough.

Accordingly, through conducting the gilding process with using the masks 10A and 10B of such the structures, as shown in FIG. 1(e), plating films of gold are formed corresponding to the piecing openings 10a and the opening portions 10c of the mask 10A and the opening portions 10d of the mask 10B, respectively, thereby building up golden upper surface terminal portions 12, golden side surface terminal portions 13, and golden lower surface terminal portions 14. At the same time, by means of the shielding portions 10b of the mask 10A, no plating film of gold is formed upon the upper surface of the upper terminal portions 7, which are provided around the plated through-holes 6 of the insulation substrate 2, therefore the plating film of copper are exposed out therefrom, i. e., forming a so-called exposing portions 15. Herein, the forming of the piecing openings 10a having the diameter "r" smaller than "R" on the above-mentioned mask 10A, corresponding to the positions of the plated through-holes 6, brings about good circulating condition for processing liquid and/or plating liquid flowing within the plated through-holes 6, and then enables to form the plating film of gold completely in the direction from the upper to the lower surfaces of the substrate, therefore being preferable for forming the golden side surface terminal portions 13 on the wall surfaces within the through-holes 6.

Figure 4:
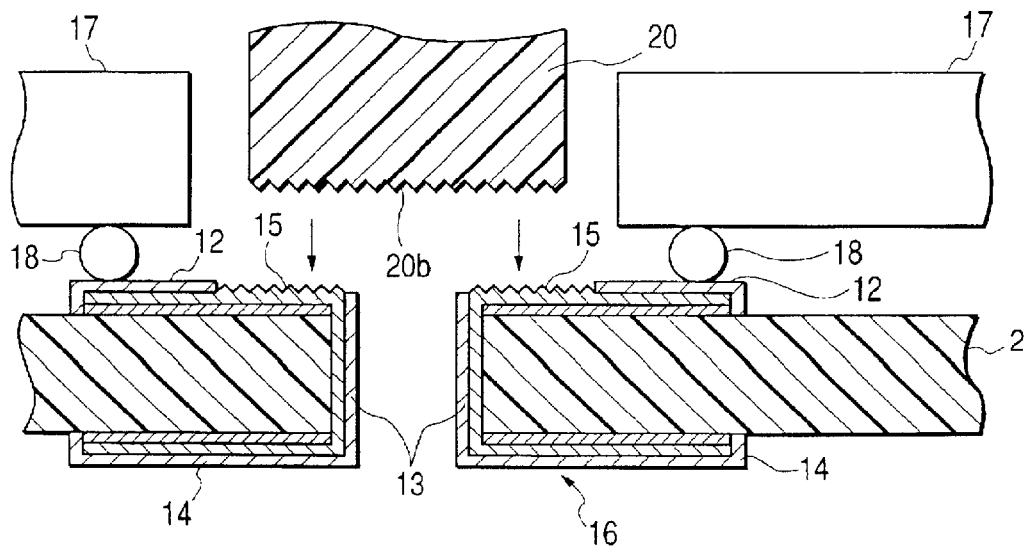
FIG. 4 is an enlarged cross-section view for showing condition of the printed wiring board before a frame member is attached on it, in particular in the manufacturing step shown in the FIG. 2(b)
Figure 5:
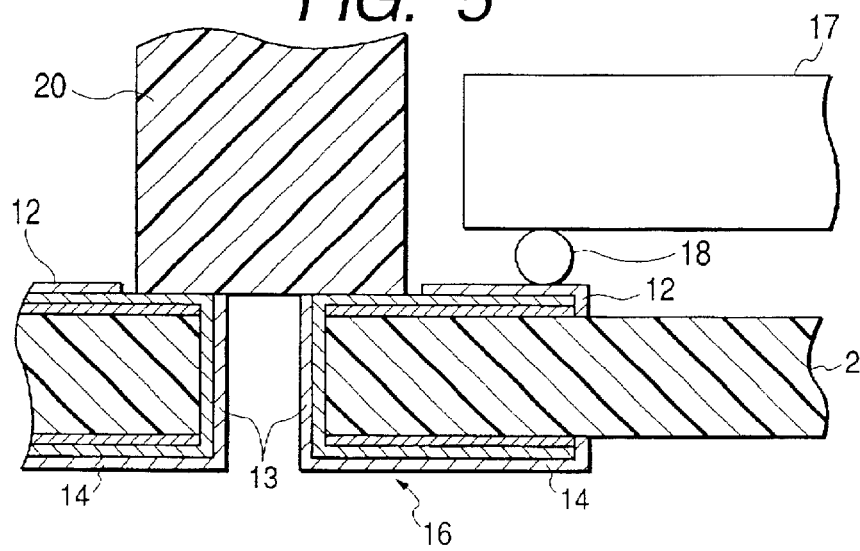
FIG. 5 is an enlarged cross-section view for showing condition where the frame member is attached and bonded on the printed wiring board, in particular in the manufacturing step shown in the FIG. 2(b)

With such the processing mentioned above, as shown in FIG. 4, the surface of the exposing portions 15 formed on the upper surface of the insulation substrate 2 in the periphery of the plated through-holes 6 is made of the plating film of copper, which can be easily treated with surface processing (for example, oxidization). Then, conducting black oxide process thereon roughens the surface of those exposing portions 15, thereby completing a printed wiring board 16 in the form to be mounted with electronic elements thereon. Thereafter, as shown in FIG. 2(a), flip-chips 17, as the electronic elements, are mounted on the completed printed wiring board 16 through bumps 18 provided on the gilded upper surface terminal portions 12 made of the plating film of gold.

Figure 6:
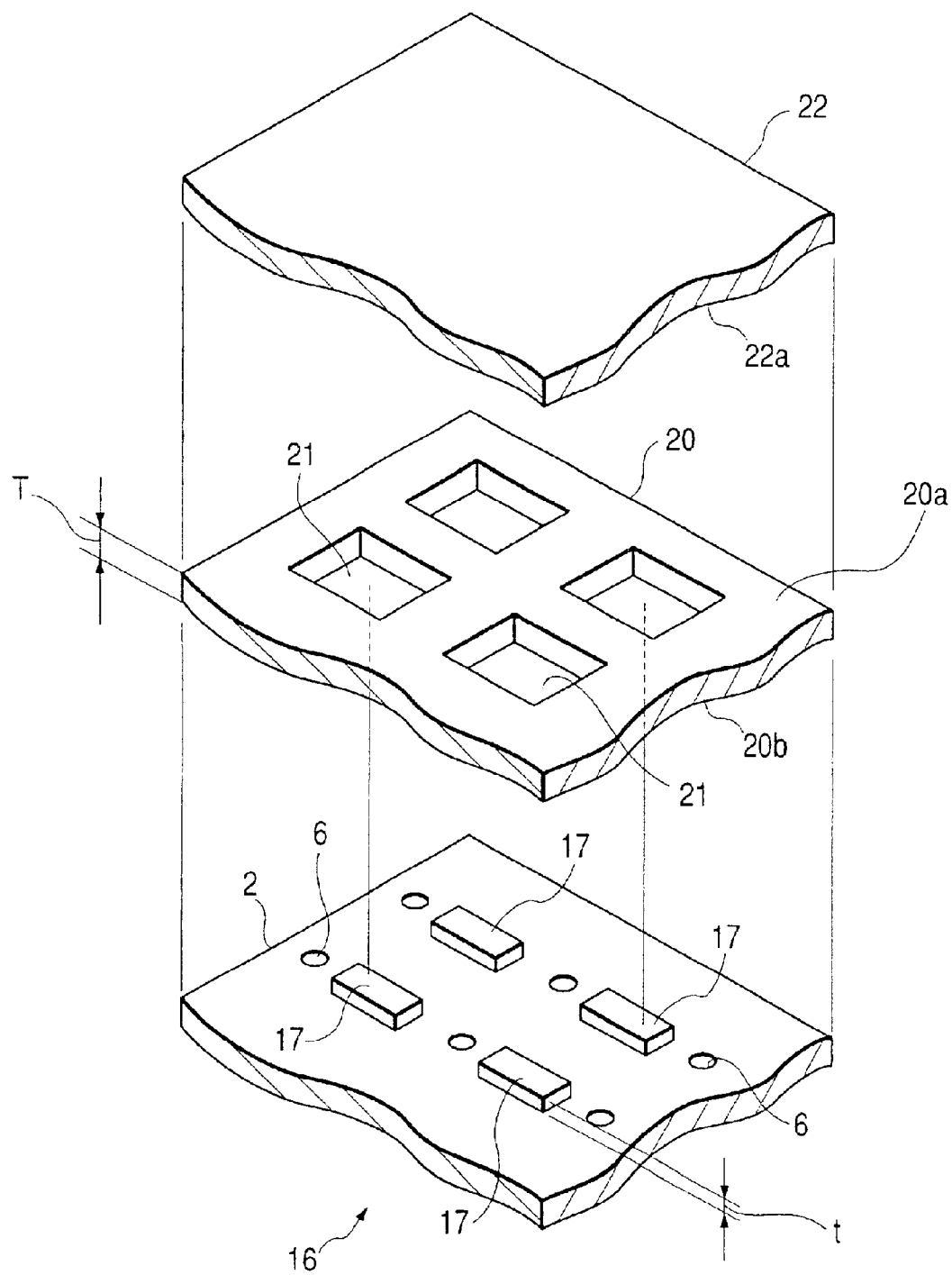
FIG. 6 is an exploded perspective view for explaining the manufacturing method of the electronic device, according to the embodiments of the present invention, which was mentioned above and will be mentioned below.

Herein, in FIG. 6, a reference numeral 20 indicates a large-sized plate of insulating resin, as a frame member 20. This frame member 20 is formed with roughened surfaces 20a and 20b (see the FIG. 4) on both sides thereof, for example, through detaching or exfoliating the copper foils of a double-sided cupper clad resin plate. Or, alternatively, an insulating resin plate 20 may be roughened on surfaces on both sides thereof. And, on this frame member 20, large number of storage holes (i.e., cavities) 25 (exemplarily, only a portion of four (4) of them are shown in the figure) are formed corresponding to the flip-chips 17 mounted on the wirings on the printed wiring board 16, in a square or circle shape, and further the thickness "T" of the frame member 20 is set to be a little bit larger than that "t" of the flip-chips 17 to be mounted. However, the cavities 21 should not be restricted only to such the square and circle in the shape thereof, but may be formed in shapes other than those.

Then, as shown in this FIG. 6, the frame member 20 is disposed on the above-mentioned printed wiring board 16 completed, so that the flip-chips 17 are received or stored within the cavities 21 of the frame member 20. In this instance, as shown in the FIG. 4, while positioning them opposite to each other and putting an adhesive, such as prepreg, etc., between them, the lower surface 20b of the frame member 20 and the exposing portions 15 are heated under application of pressure thereupon, thereby to be bonded or closely contact with each other. Also, in the FIG. 6, a reference numeral 22 indicates a copper-clad laminate, for forming a cover 22 above the frame member 20, and in this example, the roughened surface is also formed on a lower surface 22a thereof through peeling out the copper foil (not shown in the figure) from the lower surface of the double-sided copper-clad laminate, to be adhered upon the frame member 20.

Further, as shown in the FIG. 6 as well as the FIG. 2(b), the frame member 20 is covered with that cover member 22 formed from the copper clad laminate, so that the lower surface 22a thereof faces to the upper surface 20a of the frame member 20, and then they are attached or adhered with each other through the adhesive. This completes large number of the electronic devices 26, each of which stores the flip-chips 17 therein, by means of the printed wiring board 16, the frame member 20 and the cover 22. With such the structure of the electronic device as mentioned above, spaces 25 are formed by the cavities 21 of the frame member 20, each hermetically enclosing or storing the flip-chips 17 therein. In this instance, as was mentioned in the above, since the roughened surfaces are formed on the exposing portion 15 on the printed wiring board 16, or alternatively, also forming the roughened surface on the lower surface 20b of the frame member 20 opposite thereto at the same time, it is possible to improve the bonding strength or power to each other, regardless of bonding between the surface of metal and the surface of insulating resin. Also, forming the roughened surfaces upon the upper surface 20a of the frame member 20 and the lower surface 22a of the copper-clad laminate for forming the cover 22 improves the bonding power with each other, in the same manner, as well as of air-tightness of the room 26 formed by the cavities 21, thereby enabling to protect the electronic element stored therein from humidity of an outside, with certainty.

Next, as is shown in the FIG. 2(b) mentioned above, the large-sized printed wiring board 16, on which the large number of the flip-chips 17 are mounted within the cavities 21, and the frame member 20 and the cover 22, as well, are cut to be separate each, at the portions 23 corresponding to the plated through-holes 6, as indicated by one dotted chain lines in the figure, for example, by means of slicing and/or laser machining, thereby, as shown in the FIG. 2(c), completing the large number of the electronic devices 26, each mounting one flip-chip 17 within a case of the electronic device. The electronic device (for example, the SAW filter device, etc.) 26 completed in this manner will be mounted on a mother board not shown in the figure, through electrically connecting the lower surface gilder terminal portion 14 and/or the side surface gilder terminal portion 13 on land portions thereof.

In the embodiment mentioned above, the space (or cavity) 25 for hermetically sealing or enclosing the flip-chip 17 therein is constructed with the printed wiring board 16 (the insulating substrate 2) made of the cheap copper clad laminate plate, and with the frame member 20 and the cover 22, therefore it is possible to manufacture the small-sized electronic device 26, cheaply. In particular, there is a limit in the small-sizing for the structure of the conventional ceramic case, however the electronic device 26 manufactured by the method according to the present embodiment mentioned above has width, depth and height, for example, 2.5×2×1.7 (mm), thereby enabling the small-sizing of the electronic device.

Also, according to the embodiment mentioned above, the bumps 18 are applied to electrically connect the flip-chip 17 onto the upper surface terminal portion 12 on the printed wiring board 16, however it should not be restricted only to that, according to the present invention, and various connecting methods may be applied thereto, for example, through bonding wire, etc. Further, the shape of the penetrating hole 4 for forming the plated through-hole 6 on the printed wiring board 16 was explained to be circular or round in the plane view thereof in the above, but it may be rectangle in the shape. Moreover, the forming of the noble metal plating film was explained to be gold in the above, however it may be, of course, other noble metals other than that. Furthermore, forming of the plating layer of noble metal, in particular, on the portions of the conductive films or layers formed on the printed wiring board 16, exposing to the storage space (or the cavity) 25 and/or the outside, prevents oxidization thereupon, thereby enabling to ensure good conductivity thereof.

Following to the above, other embodiment of the present invention will be explained by referring to the attached drawings remained. Thus, FIGS. 7(a) through 7(e) are enlarged cross-section views for explaining a first half of manufacturing steps of the electronic device, according to the present invention; and FIGS. 8(a) through 8(c) are enlarged cross-section for explaining a second half thereof.

Figure 7A:
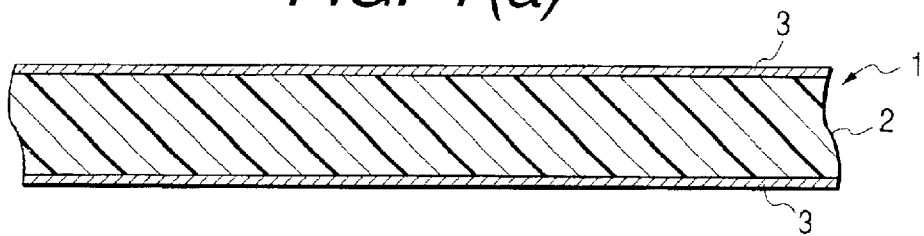
FIGS. 7(a) through 7(e) are enlarged cross-section views of a printed wiring board, for explaining a first half of manufacturing steps, in a method for manufacturing the electronic device according to another embodiment of the present invention.
Figure 7B:
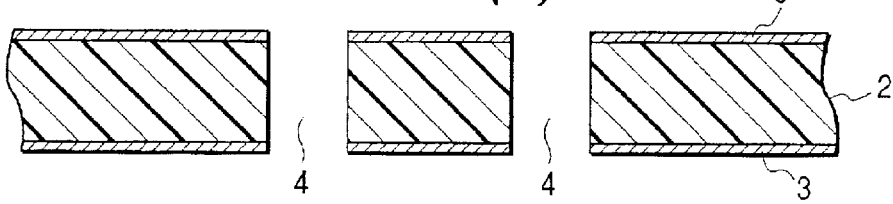
Figure 7C:
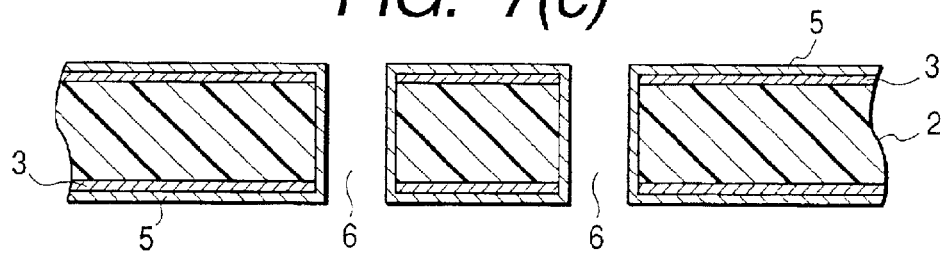

In FIG. 7(a), a double-sided copper-clad laminate plate is indicated by the reference numeral 1, as a whole, in the same manner as was in the above, and copper layers 3 and 3 are clad or attached on both side surfaces of an insulating resin plate 2. As shown in FIG. 7(b), the penetrating holes 4 and 4 are opened by means of drilling on the double-sided copper-clad laminate plate 1. Thereafter, as shown in FIG. 7(c), the panel plating of copper is conducted on it, so as to form the plating film 5 of copper on the copper foil 3, and the plating film 5 of copper on the wall surfaces within the penetrating holes 4 and 4, as well, thereby forming the plated through-holes 6 and 6, in the same manner as in the embodiment mentioned above.

Figure 7D:
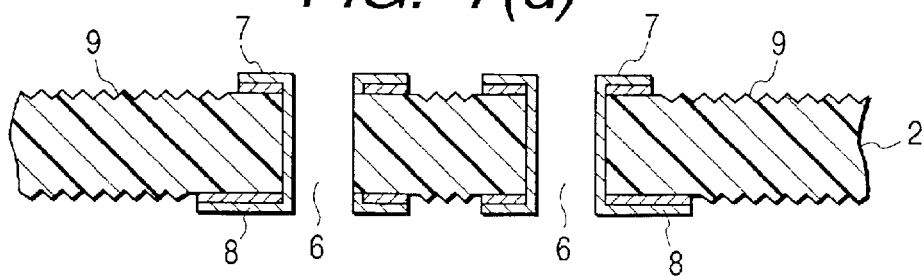
Figure 7E:
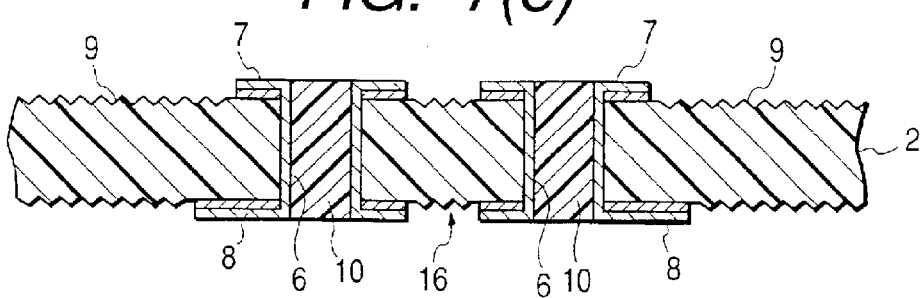

Then, as shown in FIG. 7(d), the copper foils 3 and the copper plating films 5 on both surfaces of the insulation resin substrate 2 are selectively removed, by means of etching process, thereby forming upper surface copper terminal portions 7 and lower surface copper terminal portions 8 surrounding the formed plated through-holes 6, which are electrically connected to those through-holes 6. In this instance, the roughened surfaces are formed on the surface other than the portions where the upper surface copper terminal portions 7 and the lower surface copper terminal portions 8 are formed, i.e., on the surface of the portions 9 where the copper foil 3 is removed from the double-sided copper-clad laminate plate 1. After that, as shown in FIG. 7(e), insulating resin material 10 is filled up within the plated through-holes 6 and are cured or hardened thereafter.

Figure 8A:
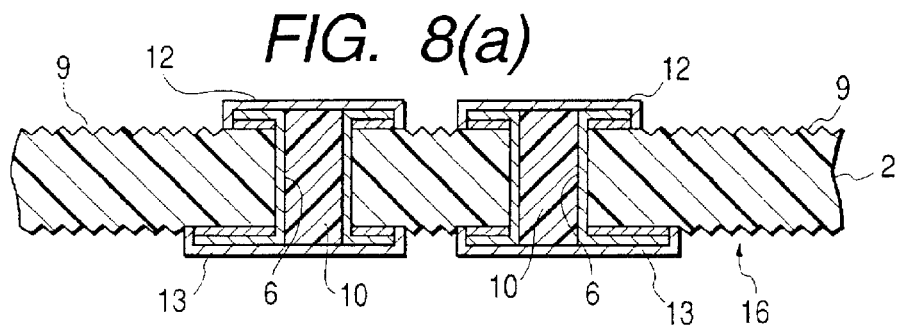
FIGS. 8(a) through 8(c) are enlarged cross-section views of the printed wiring board, but for explaining a second half of the manufacturing steps, in which an electronic element is mounted and sealed on the printed wiring board produced through the steps shown in the FIGS. 7(a) through 7(e), in the method for manufacturing the electronic device according to another embodiment of the present invention.
Figure 8B:
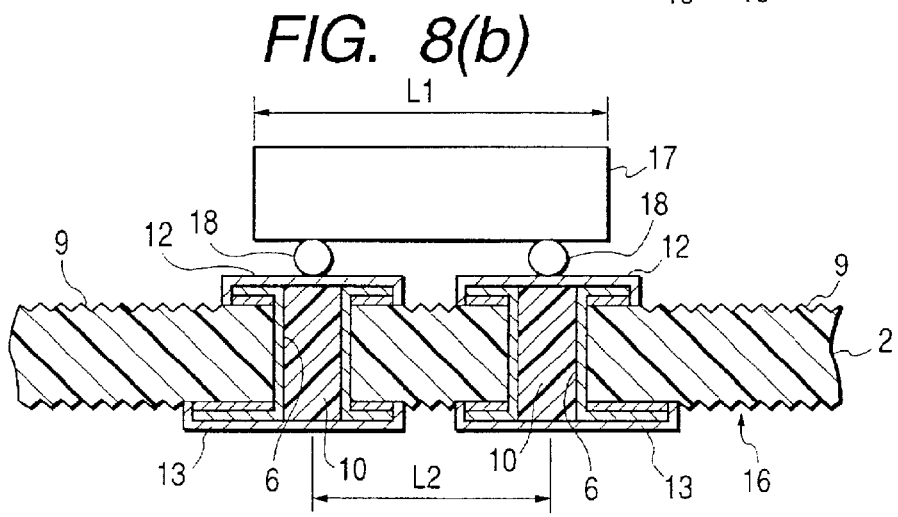
Figure 8C:
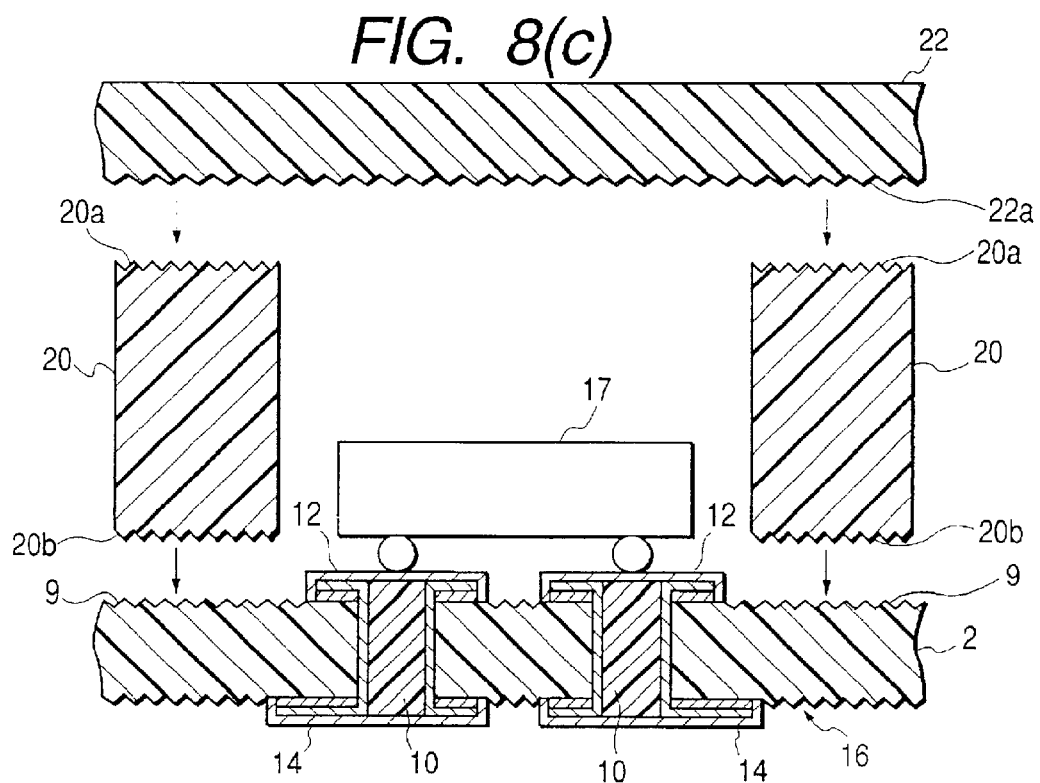

Next, as shown in FIG. 8(a), plating films of metal (such as Au, Ag, etc., of noble metals) are formed, so as to cover exposing portions on both side surfaces of the insulating resin material 10 filled up within the plated through-holes 6, as well as the upper surface copper terminal portions 7 and the lower surface copper terminal portions 8. This forms interior mounting terminals 12 and exterior mounting terminals 13 on it, thereby being completed in the form of the printed wiring board 16.

After that, as shown in FIG. 8(b), the flip-chips 17 of the electronic element, such as the SAW element, etc., are mounted on the interior mounting terminals 12 through the bumps 18. Herein, in the other embodiment, for the purpose of taking or leading out the terminals of the flip-chip to be mounted on the interior mounting terminals 12 to an outside thereof, the plated through-holes 6 formed in the printed wiring board 16 is utilized. Namely, so-called flat through-holes are formed through forming the metal plating films, so as to cover on the exposing portions on both side surfaces of the insulating resin material 10, which is filled up within the plated through-holes 6 and cured, and by using of those flat through-holes, the electrodes of the flip-chips 17 are taken or led out to the outside thereof. Herein, the flat through-hole means the structure, wherein the insulating resin material is filled up and cured within the plated through-hole formed on the substrate and on the surface(s) thereof is/are formed with a connector portion(s) of, such as a bonding pad, a connector land, or the like.

In more details thereof, as is apparent from the above-mentioned FIG. 8(b), the bumps 18 are disposed on the plated through-holes 6, which are filled up with the insulating resin material 10 therein and are covered with the upper surface copper terminal 7 and the lower surface copper terminal 12 on the both surfaces thereof. With such the structure, the positions where the plated through-holes 6 shown in the FIG. 7(b) are formed are located at or in the vicinity of the positions where the flip-chips 17 are actually mounted on. Accordingly, with this other embodiment, it is proper that the pitch L2 between a pair of the plated through-holes 6 is determined corresponding to the total length L1 of the flip-chip 17, i.e., between the electrodes provided on both sides thereof, therefore it is very preferable for achieving the small-sizing of the electronic device manufactured since it enables to make the electronic device smaller in the size thereof, comparing to that which can be obtained according to the embodiment mentioned above.

Herein, in the attached FIG. 6, again, the reference numeral 20 also indicates the large sized double-sided copper-clad laminate plate, so as to form the frame member therefrom, and the roughened surfaces 20a and 20b are formed on both surfaces thereof, through peeling out the copper foil (not shown in the figure) of the double-sided copper-clad laminate plate. Also, on this frame member 20 are formed large number of the rectangular cavities 21 corresponding to the positions of the flip-chips 17 to be mounted on the printed wiring board 16, and further the thickness "T" of the frame member 20 is determined to be a little bit larger than the thickness "t" of the flip-chip 17.

Also, in this case, the reference 22 indicates the large sized double-sided copper-clad laminate plate, so as to form the cover member therefrom, and the roughened surface is also formed on the lower surface thereof. And, as is also shown in the FIG. 8(c), the frame member 20 is disposed on the printed wiring board 16 completed, in such the manner that the flip-chips 17 are received or stored within the cavities 21 thereof. In this instance, the frame member 20 is positioned, so that the lower surface 20b thereof is confronted and contacted with the portions 9 of the insulating resin plate 2 where the copper foil 3 is peeled out or exfoliated from, and then the contacted portions are heated up under application of pressure thereupon, thereby closely contacting or bonding with each other (or may be bonded via the adhesive put between them).

Furthermore, as shown in this FIG. 8(c), the upper surface of the frame member 20 is covered with the cover member 22, while the lower surface 22a of the cover member 22 is confronted with the upper surface 20a of the frame member 20, and thereafter they are bonded with each other through the adhesive or the like. With this, as shown in FIG. 9(a), the electronic devices 26 are completed, in which the flip-chips 17 are hermetically sealed or enclosed within the cavities 21, i.e., the interior space 25, which is defined by the printed wiring board 16 and the frame member 20 and the cover member 22.

Figure 9A:
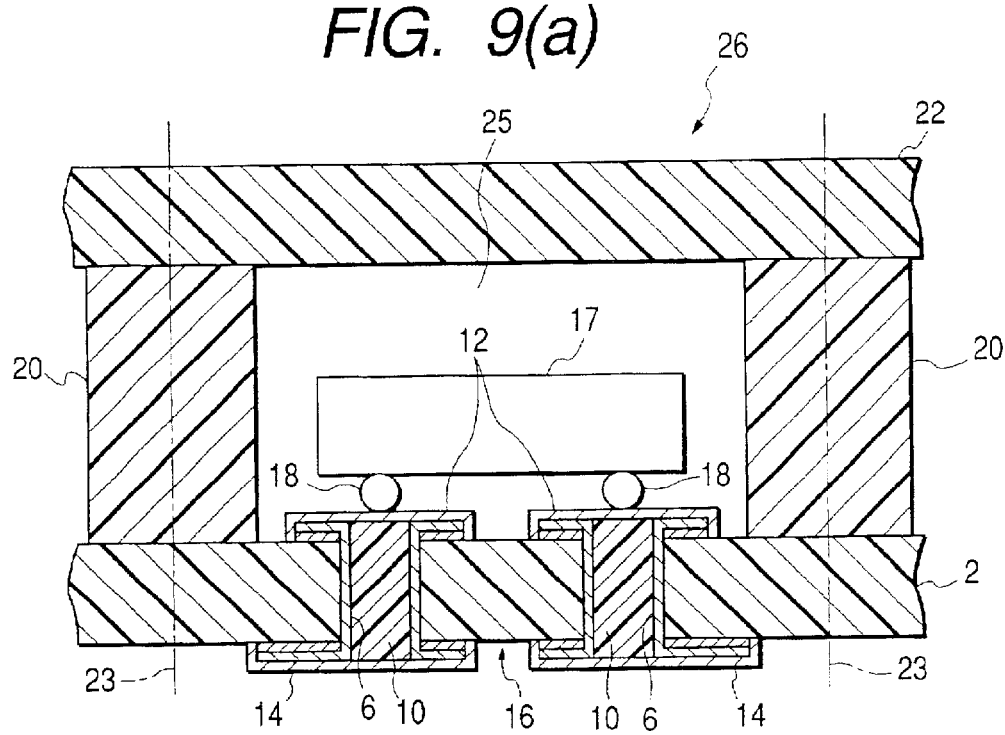
FIGS. 9(a) and 9(b) are also enlarged cross-section views of the printed wiring board, in particular in the second half of the method for manufacturing the electronic device according to another embodiment of the present invention.
Figure 9B:
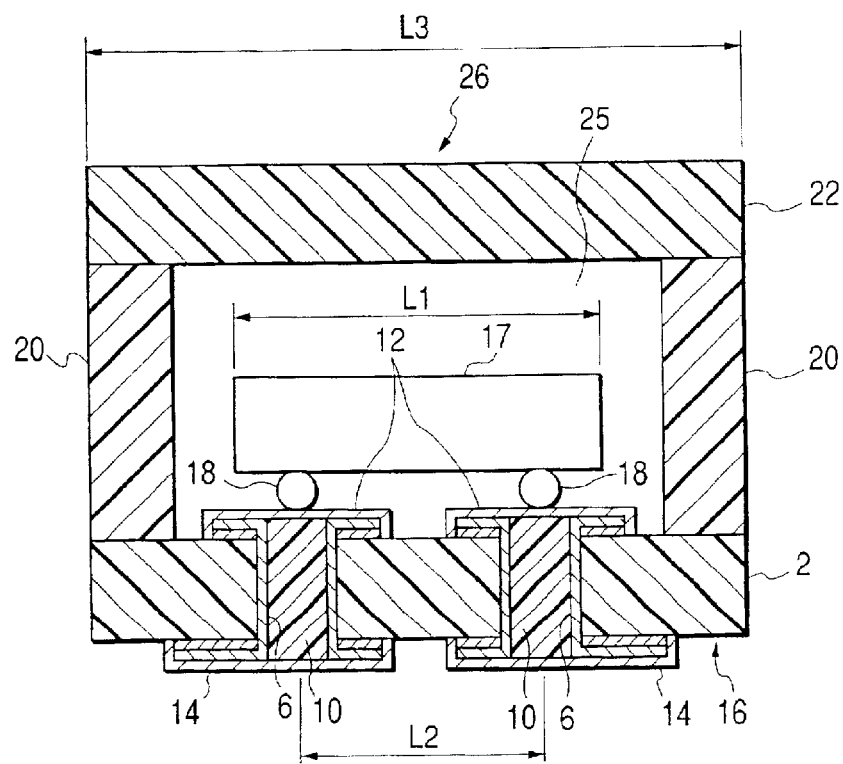

Next, as is also shown in this FIG. 9(a), they are cut to be separate to each, at the portions 23 indicated by one-dotted chain lines in the figure, by means of dicing and/or laser machining, thereby, as shown in the FIG. 9(b), completing the large number of the electronic devices 26, each mounting one piece of the electronic element (i.e., the flip-chip 17) within the cavity 21 a thereof. The electronic device 26 completed in this manner will be mounted on a mother board not shown in the figure, through electrically connecting the exterior connector terminal 13 (on the lower surface of the electronic device 26, in this example) on land portions thereof.

However, with such the structure as was mentioned in the above, the portions being confronted and contacted with the lower surface 20b of the frame member 20 are the portions 9 at which the copper foils 3 are removed from the surfaces of the insulating resin plate (the substrate) constructing the printed wiring board 16, and then there is formed no such the metal layer nor film thereon, but bonding between the insulating resins, therefore, it is possible to obtain better bonding condition (or stronger bonding power) between them, comparing to that obtained between the surfaces of the metal and the insulating resin. In addition thereto, forming of the roughened surface upon, at least one of those contacting surfaces (however, on the both of them in this embodiment), achieves the bonding condition being superior in the air-tightness. Furthermore, the roughened surfaces are also formed on the upper surface 20a of the frame member 20 and the lower surface 22a of the cover member 22, respectively, thereby improving the bonding power between them, in the same manner as was mentioned in the above. Namely, with this, it is possible to improve the air-tightness within the interior space 25 (or the cavity 21) of the electronic device 26 manufactured, and to protect the electronic element stored inside from ill influences of the outside thereof, such as the humidity, etc., with certainty.

Further, in the electronic device 26 according to the other embodiment, as was mentioned in the above, the so-called the flat through-holes are used for the purpose of achieving the taking or leading out of the electrode terminals of the electronic element (i.e., the flip-chip 17) stored within the interior space 25 (i.e., the cavity 21) to the outside thereof. With this, there is no need of forming the conductors (i.e., the electrodes made of metal layer or film) on the upper surface of the insulating resin plate 2, extending aside beyond the space 25 (or the cavity 21), namely crossing over the lower surface 20b of the frame member 20, therefore, as was mentioned in the above, it is possible to make the size L3 short in the direction of width of the electronic device 26 completed, as well as to improve the bonding power between the printed wiring board 16 and the frame member 20. In particular, forming of those flat through-holes at the positions corresponding to where the electrodes of the electronic element (i.e., the flip-chip 17) are located when it is mounted on the printed wiring board 16 is most preferable for achieving the small-sizing of the electronic device completed. Furthermore, with the electronic device manufactured by the method of the other embodiment mentioned above, it is also possible to make it small in the sizes, width, depth and height, 2.5×2×1.7 (mm), in the same manner as mentioned above. In addition thereto, with the electronic device according to this other embodiment, it is also same to the above that the electronic device 26 can be manufactured cheaply, by using the cheap copper clad laminate plates.

Also, though electrical connection of the flip-chip 17 as a part to be mounted onto the upper terminal portion 12 of the printed wiring board 16 is achieved through the bumps 18, in the other embodiment mentioned in the above, however it can be achieved through various methods, including such as the wire bonding, etc., for example. And the plated through-holes 6 are located at the positions corresponding to those of the bumps 18 to be mounted, however they may be shifted inside or outside a little bit therefrom. Further, the shape of the cavity 21 of the frame member 20 should not be restricted only to the rectangular one, but may be formed in various shapes. Furthermore, in those embodiments mentioned above, the explanation was given by taking the SAW element, as the example of the electronic element to be sealed inside, however the present invention should not be restricted only to this, and it may be an optical device, such as a CCD element or an element for use of auto-focusing, etc., as the electronic parts for constructing a digital camera, for example. In such the case, the cover member 22 adhered on the upper surface 20a of the frame member 20 may be preferably made of transparent material, such as a glass, so that lights from an outside can be incident upon on the surface of the electronic element stored within the inside thereof. Also, it is possible to form a portion of the cover member 22 of the glass in a lens-like shape if necessary.

As is apparent from the explanation fully mentioned in the above, according to the present invention, there is provided the electronic device having the structure, which hermetically seals the electronic element therein, and can be manufactured cheaply, and a method for manufacturing thereof, and further there is provided a printed wiring board being suitable for use in such the electronic device and the manufacturing method thereof.

Also, according to the present invention, since the electronic devices are constructed with the large-sized copper-clad laminate, for forming the printed wiring board, as well as the frame member and the cover member therefrom, in the large number thereof at the same time, to be divided or separated to each thereafter, therefore it is possible to manufacture the electronic devices, each sealing the electronic element therein with high air-tightness, more cheaply.

Also, according to the present invention, since there is no need for forming the electrode patterns on the printed wiring board, extending the interior terminal portion for use of mounting aside, so as to be electrically connected to an outside, the electronic device can be manufactured much smaller in the sizes thereof.

Further, according to the present invention, since the electronic element is sealed within the interior space for storage thereof., at high air-tightness by means of the frame member and the cover member, it is possible to protect the electronic element from being deteriorated by humidity, thereby improving the corrosion-proof property of the element stored therein. Also, the roughened surfaces formed on surfaces of the members to be bonded to each other makes the bonding ease, as well as, increasing up the bonding power, thereby improving the air-tightness of the storage space formed inside by those members.

While we have shown and described several embodiments in accordance with our invention, it should be understood that the disclosed embodiments are susceptible of changes and modifications without departing from the scope of the invention. Therefore, we do not intend to be bound by the details shown and described herein but intend to cover all such changes and modifications falling within the ambit of the appended claims.

What is claimed is:

1. An electronic device, comprising:
   a substrate of insulating resin having at least a pair of interior terminal portions for connection upon an upper surface thereof;
   an electronic element mounted on the terminal portions on the upper surface of said substrate, having at least a pair of electrode terminals thereof;
   a frame member of insulating resin, bonded on the upper surface of said substrate, and having a cavity formed for storing said electronic element therein;
   at least a pair of exterior terminal portions for connection, formed on an outer peripheral surface of said substrate, being electrically conducted to said interior terminals; and
   a cover member of insulating material, for hermetically sealing over the cavity of said frame member, in which said electronic element is stored, wherein roughened surfaces are formed on metal electrode portions, which are formed on the upper surface of said substrate for electrically conducting said interior terminal portions to said exterior terminal portions, where said frame member is bonded thereupon.

2. An electronic device as defined in the claim 1, wherein the metal electrode portions forming said interior terminal portions, on which the roughened surfaces are formed to be bonded with said frame member, are made of copper.

3. An electronic device as defined in the claim 1, wherein said terminal portions for exterior connection are formed upon concave portions on side surfaces of said substrate, being provided extending from the upper surface to the lower surface thereof.

4. An electronic device as defined in the claim 1, wherein said terminal portions for exterior connection are formed upon concave portions on side surfaces of said substrate, being provided on corners extending from the upper surface to the lower surface hereof.

5. An electronic device as defined in the claim 1, wherein said substrate, said frame member and said cover member are formed from plate-like members of metal-clad laminate.

6. An electronic device as defined in the claim 1, wherein said electronic element stored thin said cavity is an optical element, and said cover member for sealing over said cavity is made of transparent material.

7. A printed wiring board for use of the electronic devices according to the claim 1, comprising a plate made of insulating resin, and plural number of electrode portions for use of said terminals for interior connection, which are formed at or in vicinity of the electrode portions of plural number of the electronic devices to be mounted thereon.

8. A printed wiring board for use of the electronic devices, as defined in the claim 7, wherein said electrode portions are plated through-holes, which are formed on said insulating resin plate and are filled up with non-conductive resin therein.

9. An electronic device as defined in the claim 1, wherein exterior terminal portions for connection, being electrically connected with said interior terminal portion, are provided on a lower surface of said substrate.

10. An electronic device as defined in the claim 1, wherein conductors formed on said substrate, exposing to said cavity and the outside are made from layers of noble metal.

11. A method for manufacturing an electronic device, comprising the following steps:
    (a) forming at least a pair of terminal portions for interior connection, on an upper surface of a substrate of insulating resin;
    (b) mounting an electronic element on the terminal portions for interior connection, on the upper surface of said substrate;
    (c) bonding a frame member of insulating resin on the upper surface of said substrate, so as to form a cavity in which said electronic element is stored; and
    (d) bonding a cover member of insulating material on said frame member for hermetically sealing over the cavity thereof, in which said electronic element is stored, wherein in the step of said step (a), roughened surfaces are formed on metal electrodes, which are provided for electrically conducting said terminal portions for interior connection to an outside thereof, where said frame member is bonded thereon.

* * * * *